United States Patent [19]

Borsenberger

[11] Patent Number: 4,540,647
[45] Date of Patent: Sep. 10, 1985

[54] METHOD FOR THE MANUFACTURE OF PHOTOCONDUCTIVE INSULATING ELEMENTS WITH A BROAD DYNAMIC EXPOSURE RANGE

[75] Inventor: Paul M. Borsenberger, Hilton, N.Y.

[73] Assignee: Eastman Kodak Company, Rochester, N.Y.

[21] Appl. No.: 642,604

[22] Filed: Aug. 20, 1984

[51] Int. Cl.³ .................. G03G 5/082; B05D 3/06
[52] U.S. Cl. ................... 430/128; 430/136; 427/39; 427/74
[58] Field of Search ............ 430/128, 136; 427/39, 427/74

[56] References Cited

U.S. PATENT DOCUMENTS

| | | | |
|---|---|---|---|
| 4,225,222 | 9/1980 | Kempter | 355/3 DR |
| 4,265,991 | 5/1981 | Hirai et al. | 430/64 |
| 4,359,512 | 11/1982 | Fukuda et al. | 430/57 |
| 4,359,514 | 11/1982 | Shimizu et al. | 430/65 |
| 4,377,628 | 3/1983 | Ishioka et al. | 430/57 |
| 4,403,026 | 9/1983 | Shimizu et al. | 430/65 |
| 4,409,308 | 10/1983 | Shimizu et al. | 430/60 |
| 4,443,529 | 4/1984 | Kanbe et al. | 430/65 |

FOREIGN PATENT DOCUMENTS

| | | | |
|---|---|---|---|
| 56-116037 | 9/1981 | Japan | 430/136 |
| 58-124224 | 7/1983 | Japan | 430/128 |
| 2018446 | 10/1979 | United Kingdom . | |

Primary Examiner—Roland E. Martin
Attorney, Agent, or Firm—Alfred P. Lorenzo

[57] ABSTRACT

An improved method for the manufacture of a photoconductive insulating element comprising an electrically-conductive support, a barrier layer overlying the support, and a layer of doped hydrogenated amorphous silicon overlying the barrier layer, wherein the doped layer is formed by a process of plasma-induced dissociation of a gaseous mixture of a silane and a doping agent, and the dissociation is a temperature-controlled process in which deposition of a final portion of the doped layer is carried out at a temperature which is less than the temperature used in forming the initial portion of the doped layer. Control of the temperature of the deposition process in this manner provides a substantial increase in the dynamic exposure range of the element.

11 Claims, No Drawings

METHOD FOR THE MANUFACTURE OF PHOTOCONDUCTIVE INSULATING ELEMENTS WITH A BROAD DYNAMIC EXPOSURE RANGE

FIELD OF THE INVENTION

This invention relates in general to electrophotography and in particular to photoconductive insulating elements containing a layer of doped hydrogenated amorphous silicon. More specifically, this invention relates to an improved method for the manufacture of photoconductive insulating elements comprising an electrically-conductive support, a barrier layer overlying the support, and a layer of doped hydrogenated amorphous silicon overlying the barrier layer, whereby the element is especially adapted to provide a broad dynamic exposure range.

BACKGROUND OF THE INVENTION

Photoconductive elements comprise a conducting support bearing a layer of a photoconductive material which is insulating in the dark but which becomes conductive upon exposure to radiation. A common technique for forming images with such elements is to uniformly electrostatically charge the surface of the element and then imagewise expose it to radiation. In areas where the photoconductive layer is irradiated, mobile charge carriers are generated which migrate to the surface of the element and there dissipate the surface charge. This leaves behind a charge pattern in nonirradiated areas, referred to as a latent electrostatic image. This latent electrostatic image can then be developed, either on the surface on which it is formed, or on another surface to which it has been transferred, by application of a liquid or dry developer composition which contains electroscopic marking particles. These particles are selectively attracted to and deposit in the charged areas or are repelled by the charged areas and selectively deposited in the uncharged areas. The pattern of marking particles can be fixed to the surface on which they are deposited or they can be transferred to another surface and fixed there.

Photoconductive elements can comprise a single active layer, containing the photoconductive material, or they can comprise multiple active layers. Elements with multiple active layers (sometimes referred to as multi-active elements) have at least one charge-generating layer and at least one charge-transport layer. The charge-generating layer responds to radiation by generating mobile charge carriers and the charge-transport layer facilitates migration of the charge carriers to the surface of the element, where they dissipate the uniform electrostatic charge in light-struck areas and form the latent electrostatic image.

The photoreceptor properties that determine the radiation necessary to form the latent image are the quantum efficiency, the thickness, the dielectric constant, and the existence of trapping. In the simplest case, where trapping can be neglected, the exposure can be expressed as:

$$E = \frac{\epsilon k}{Le\lambda}\left(\frac{\Delta V}{\phi}\right)$$

where E is the exposure in ergs/cm$^2$, $\epsilon$ the relative dielectric constant, L the thickness in cm, e the electronic charge in esu, $\lambda$ the wavelength in nm, $\phi$ the quantum efficiency, k a constant equal to $5.2 \times 10^{-13}$, and $\Delta V$ the voltage difference between the image and background area, $V_i - V_b$. The quantum efficiency, which cannot exceed unity, represents the fraction of incident photons that are absorbed and result in free electron-hole pairs.

For electrophotographic processes known heretofore, $\Delta V$ is typically 400–500 V. Assuming typical values of $\epsilon = 3.0$, $\lambda = 500$ nm, and $L = 10^{-3}$ cm, the above equation predicts an exposure energy of 11.8 to 14.7 ergs/cm$^2$. This assumes that there is no trapping and is based on the absorbed radiation. In practice, the radiation is not completely absorbed, and the exposure is correspondingly larger. Thus, most photoreceptors require exposures in the range of 20–100 ergs/cm$^2$ to form an electrostatic image. These are equivalent to ASA ratings between 0.1 and 0.02. In contrast, the exposure required to form a latent image in conventional silver halide photography is in the range of $10^{-2}$ to $10^{-1}$ ergs/cm$^2$, or less, and, accordingly, the radiation sensitivity of electrophotography is less than that of conventional silver halide photography by a factor of at least $10^{-3}$.

In addition to electrophotographic speed, an important parameter with regard to the use of a photoconductive insulating element in an electrophotographic process is the exposure latitude, or, as it is often called, the dynamic exposure range. The conventional method for characterizing the response of a photoreceptor is to plot the surface potential versus the logarithm of the exposing radiation for a given initial potential, $V_o$. Since the logarithm of exposure represents the optical density of the image which is to be reproduced, the linear portion of the V-logE curve gives the range of optical density in which the image can be faithfully reproduced by the surface potential. This exposure range is usually described as the dynamic range. Images comprised of a range of optical densities in excess of the dynamic range cannot be accurately reproduced by the photoreceptor surface potential. For this reason, the photoreceptor dynamic range is a critical parameter in the electrophotographic process.

The usual method for evaluating the dynamic range is based on a technique employed in conventional photography. This technique involves the following steps:

(1) The surface potential in volts is plotted versus the logarithm of the exposing radiation for a given initial potential $V_o$, to thereby provide a V-logE curve.

(2) The derivative of the curve is then determined and plotted on the same exposure axis. The derivative is expressed in units of volts/logE and defined as the contrast, $\gamma$.

(3) The dynamic exposure range, in units of logE, is then defined as the ratio of the initial potential, $V_o$, to the maximum contrast, $\gamma_{max}$. Defined in this manner, the experimental values of the dynamic exposure range very closely approximate the range of optical densities that can be accurately reproduced by the photoreceptor surface potential.

The fundamental phenomenon that controls the maximum contrast is the field dependence of the quantum efficiency, $\phi$ (E). In cases where the efficiency is weakly field dependent, the contrast is high and the dynamic range correspondingly low. Conversely, materials which have strongly field dependent quantum efficiencies are low contrast, high range materials.

Photoconductive insulating elements comprising one or more layers of doped hydrogenated amorphous silicon have many valuable properties which render them commercially attractive and are currently of widespread interest in the art, but they exhibit a rather high contrast and thus a rather narrow dynamic exposure range, typically a range of about 0.7 to about 0.8 logE. While values of this magnitude are usually sufficient for the reproduction of digital information (line copy, for example), they are not sufficient for continuous tone reproduction (pictorial information, for example). Thus, the art of electrophotography would be greatly benefitted by the development of a successful technique for extending the dynamic exposure range of this important new class of photoconductive elements.

The most useful process for the manufacture of photoconductive insulating elements comprising a layer of doped hydrogenated amorphous silicon is a process comprising plasma-induced dissociation of a gaseous mixture of a silane (for example $SiH_4$) and a doping agent, such as phosphine gas ($PH_3$) or diborane gas ($B_2H_6$). This process is carried out at elevated temperatures and reduced pressures, typically at temperatures of above 200° C. and pressures of about one Torr.

It is toward the objective of providing an improved plasma-induced dissociation process for the manufacture of photoconductive insulating elements comprising a layer of doped hydrogenated amorphous silicon, whereby an extended dynamic exposure range is achieved, that the present invention is directed.

SUMMARY OF THE INVENTION

The invention is an improvement in a method for the manufacture of a photoconductive insulating element comprising an electrically-conductive support, a barrier layer overlying the support, and a layer of doped hydrogenated amorphous silicon overlying the barrier layer. The method is one in which the layer of doped hydrogenated amorphous silicon is formed by a process of plasma-induced dissociation of a gaseous mixture of a silane and a doping agent. The improvement constitutes controlling the temperature of the dissociation process so that an initial major portion of the layer of doped hydrogenated amorphous silicon is formed at a temperature in the range of from 200° C. to 400° C. and a final minor portion of the layer of doped hydrogenated amorphous silicon is formed at a temperature in the range of from 125° C. to 175° C. Such control of the temperature in the manufacturing process has been unexpectedly found to bring about a substantial increase in the dynamic exposure range of the element as compared to an otherwise identical element manufactured by a process in which the temperature utilized is a temperature above 200° C. in accordance with the practice of the prior art.

A variety of ways of providing the desired temperature control are feasible. Thus, for example, the process can be a two-stage process utilizing a high fixed temperature, for example 250° C., in the first stage and a low fixed temperature, for example 150° C., in the second stage. As an alternative, the process can be a multi-stage process beginning at a high initial temperature, such as a temperature of 250° C., and declining in a series of several stages, each of which utilizes a lower temperature than the stage before, to terminate at a low temperature, such as 150° C. As a still further alternative, the process can involve a steady gradual decrease from a high initial temperature, such as 250° C., to a low final temperature, such as 150° C. In utilizing any of these alternatives, however, it is necessary that a major portion of the doped layer, that is more than half of its total thickness, be formed at temperatures in the range of from 200° C. to 400° C. and that only a minor portion of the doped layer, that is less than half of its total thickness, be formed at temperatures in the range of from 125° C. to 175° C.

DESCRIPTION OF THE PREFERRED EMBODIMENTS

The preparation of thin films of amorphous silicon, hereinafter referred to as α-Si, by the glow discharge decomposition of silane gas, $SiH_4$, has been known for a number of years. (See, for example, R. C. Chittick, J. H. Alexander and H. F. Sterling, J. Electrochem. Soc., 116, 77, 1969 and R. C. Chittick, J. N-Cryst. Solids, 3, 255, 1970). It is also known that the degree of conductivity and conductivity type of these thin films can be varied by doping with suitable elements in a manner analogous to that observed in crystalline semiconductors. (See, for example, W. E. Spear and P. G. LeComber, Solid State Commun., 17, 1193, 1975). Furthermore, it is widely recognized that the presence of atomic hydrogen plays a major role in the electrical and optical properties of these materials (see, for example, M. H. Brodsky, Thin Solid Films, 50, 57, 1978) and thus there is widespread current interest in the properties and uses of thin films of so-called "hydrogenated amorphous silicon," hereinafter referred to as α-Si(H).

The field of electrophotography is one in which there is extensive current interest in the utilization of thin films of α-Si(H). To date, the art has disclosed a wide variety of photoconductive insulating elements, comprising thin films of intrinsic and/or doped α-Si(H), which are adapted for use in electrophotographic processes. (As used herein, the term "a doped α-Si(H) layer" refers to a layer of hydrogenated amorphous silicon that has been doped with one or more elements to a degree sufficient to render it either n-type or p-type). Included among the many patents and published patent applications describing photoconductive insulating elements containing layers of intrinsic and/or doped α-Si(H) are the following:

Misumi et al, U. K. patent application No. 2,018,446 A, published Oct. 17, 1979.
Kempter, U.S. Pat. No. 4,225,222, issued Sept. 30, 1980.
Hirai et al, U.S. Pat. No. 4,265,991, issued May 5, 1981.
Fukuda et al, U.S. Pat. No. 4,359,512, issued Nov. 16, 1982.
Shimizu et al, U.S. Pat. No. 4,359,514, issued Nov. 16, 1982.
Ishioka et al, U.S. Pat. No. 4,377,628, issued Mar. 22, 1983.
Shimizu et al, U.S. Pat. No. 4,403,026, issued Sept. 6, 1983.
Shimizu et al, U.S. Pat. No. 4,409,308, issued Oct. 11, 1983.
Kanbe et al, U.S. Pat. No. 4,443,529, issued April 17, 1984.

As indicated hereinabove, the method of this invention involves temperature control of a process of plasma-induced dissociation of a gaseous mixture of a silane and one or more doping agents, whereby an initial major portion of a layer of doped α-Si(H) is formed at a temperature in the range of from 200° C. to 400° C.—which is the temperature range typically utilized heretofore in the preparation of such a layer—while a final minor portion of the layer is formed at a temperature in the range of from 125° C. to 175° C. Thus, while the conventional process of the prior art typically employs a single temperature, for example 250° C., for the entire deposition, the novel process of this invention controls the temperature so that the deposition process is completed at a temperature which is significantly less than that at which it commenced.

In the process of plasma-induced dissociation of SiH$_4$, it is believed that a variety of chemical species are formed, e.g., SiH, SiH$_2$ and SiH$_3$, that are intermediate species in the formation of more stable compounds. It is not known with certainty why control of the temperature of the dissociation process in the manner described herein provides the beneficial result of a broad dynamic exposure range. It is believed that it may be the result of the creation of a hydrogen concentration "profile" in the doped layer. Thus, at the higher temperatures which are used in forming the initial portion of the layer, a lower hydrogen concentration can be expected to occur, while at the lower temperatures which are used in forming the final portion of the layer, a higher hydrogen concentration can be expected to occur. The result would be a hydrogen "profile", that is, a variation in hydrogen concentration in the direction of the thickness of the layer. Other features might also be significant, such as, for example, the creation of a profile with respect to the concentration of particular intermediate species generated and resulting modification in the properties of the layer.

The photoconductive insulating elements with which this invention is concerned comprise:

(a) an electrically-conductive support, by which is meant a support material which is itself electrically conductive or which is comprised of an electrically-insulating material coated with an electrically-conductive layer, (b) a barrier layer overlying the support, by which is meant a layer which serves to prevent the migration of charge-carriers from the support into the photoconductive layers of the element, and (c) a layer of doped $\alpha$-Si(H), by which is meant an hydrogenated amorphous silicon layer which has been modified by doping with one or more of the many different doping agents known to the art.

The process of this invention is applicable to the manufacture of a very wide variety of different photoconductive elements as long as they include features (a), (b) and (c) specified above. Thus, for example, the elements can include two or more doped $\alpha$-Si(H) layers that are doped with different doping agents or with differing amounts of the same doping agent, and can include one or more intrinsic $\alpha$-Si(H) layers in addition to one or more doped $\alpha$-Si(H) layers.

The elements prepared in accordance with the process of this invention include an electrically-conductive support, and such support can be either an electrically-conductive material or a composite material comprised of an electrically-insulating substrate coated with one or more conductive layers. The electrically-conductive support should be a relatively rigid material and preferably one that has a thermal expansion coefficient that is fairly close to that of a layer of $\alpha$-Si(H). Particularly useful materials include aluminum, steel, and glass that has been coated with a suitable conductive coating. Preferably, the support is fabricated in a drum or tube configuration, since such configurations are most appropriate for use with a relatively brittle and fragile material such as $\alpha$-Si(H).

A particularly important feature of photoconductive insulating elements comprised of amorphous silicon is the barrier layer. It serves to prevent the injection of charge carriers from the substrate into the photoconductive layers. Specifically, it prevents the injection of holes from the substrate when the photoreceptor is charged to a negative potential, and it prevents the injection of electrons from the substrate when the photoreceptor is charged to a positive potential. Either positive or negative charging can, of course, be used in electrophotographic processes, as desired. Inclusion of a barrier layer in the element is necessary in order for the element to provide adequate charge acceptance.

A number of materials are known to be useful to form a barrier layer in an amorphous silicon photoconductive insulating element. For example, useful materials include oxides such as silicon oxide (SiO) or aluminum oxide ($Al_2O_3$). Preferably, the barrier layer is a layer of $\alpha$-Si(H) which has been heavily doped with a suitable doping agent. The term "heavily doped", as used herein, is intended to mean a concentration of doping agent of at least 100 ppm.

The hydrogen content of the doped $\alpha$-Si(H) layer can be varied over a broad range to provide particular characteristics as desired. Generally, the hydrogen content is in the range of 1 to 50 percent and preferably in the range of 5 to 25 percent (the content of hydrogen being defined in atomic percentage).

Many different doping agents are known in the art to be of utility in advantageously modifying the characteristics of a layer of $\alpha$-Si(H). Included among such doping agents are the elements of Group VA of the Periodic Table, namely N, P, As, Sb and Bi, which provide an n-type layer—that is, one which exhibits a preference for conduction of negative charge carriers (electrons)—and the elements of Group IIIA of the Periodic Table, namely B, Al, Ga, In and Tl, which provide a p-type layer—that is one which exhibits a preference for conduction of positive charge carriers (holes). The preferred doping agent for forming an n-type layer is phosphorus, and it is conveniently utilized in the plasma-induced dissociation in the form of phosphine gas ($PH_3$). The preferred doping agent for forming a p-type layer is boron, and it is conveniently utilized in the plasma-induced dissociation in the form of diborane gas ($B_2H_6$).

The concentration of doping agent employed in forming the doped $\alpha$-Si(H) layer can be varied over a very broad range. Typically, the doping agent is employed in an amount of up to about 1,000 ppm in the gaseous composition used to form the doped layer, and preferably in an amount of about 15 to about 150 ppm. When a doped $\alpha$-Si(H) layer is utilized as the barrier layer in the element, it is typically a heavily doped layer, for example, a layer formed from a composition containing 500 to 5,000 ppm of the doping agent.

The effect of a doping agent on dark resistivity depends on the particular agent and concentration utilized. For example, at concentrations up to about 30 ppm of boron, the dark resistivity increases with increasing boron concentration. Above this range, the opposite occurs.

The method of this invention can be advantageously employed in the manufacture of photoconductive insulating elements that are especially adapted for use in the novel low field electrophotographic process described in copending U.S. patent application Ser. No. 642,603 filed Aug. 20, 1984, entitled, "Low Field Electrophotographic Process," by P. M. Borsenberger. As described in this application, the disclosure of which is incorporated herein by reference, a very high speed electrophotographic process is attainable under conditions where the magnitude of $\Delta V$ (the voltage difference between the image and background areas) is very low. However, the magnitude of the background voltage, $V_b$, must also be low, since a reduction in $\Delta V$ without a corresponding reduction in $V_b$ results in a very low signal to noise ratio. As explained in the aforesaid copending application, a reduction in both $\Delta V$ and $v_b$ requires that the photoreceptor be initially charged to a very low voltage and, typically, this is not feasible, since quantum efficiency of photoconductive insulating elements decreases sharply with decreasing voltage. The desired result is achieved in the process of the copending application by the use of a photoconductive insulating element which exhibits high quantum efficiency at low voltage. This element is comprised of (a) an electrically-conductive support, (b) a barrier layer overlying the support, and (c) a photoconductive stratum overlying the barrier layer which comprises a layer of intrinsic $\alpha$-Si(H) in electrical contact with a layer of doped $\alpha$-Si(H), the doped layer being very thin in relation to the thickness of the intrinsic layer.

By employing the method of this invention in the manufacture of the photoconductive insulating elements which are especially adapted for use in the process of the copending application, a highly advantageous combination of characteristics is achieved—namely, very high electrophotographic speed, low electrical noise, and a broad dynamic exposure range.

The method of this invention is useful in preparing photoconductive insulating elements in which the thickness of the various layers is widely varied, as desired. The barrier layer will typically have a thickness in the range of from about 0.01 to about 5 microns. The layer of doped $\alpha$-Si(H) will typically have a thickness in the range of from about 1 to about 50 microns.

As previously indicated, the preferred doping agent for forming an n-type layer is phosphorus, and the preferred doping agent for forming a p-type layer is boron. These agents are preferably utilized in the doped layer at a concentration of about 15 to about 150 ppm.

The amount of doping agent utilized needs to be carefully controlled to achieve optimum results. For example, an amount of doping agent which is too low will result in an undesirably low quantum efficiency, while an amount of doping agent that is too great will result in an excessively high dark conductivity.

In addition to the essential layers described hereinabove, the photoconductive insulating elements employed in the process of this invention can contain certain optional layers. For example, they can contain anti-reflection layers to reduce reflection and thereby increase efficiency. Silicon nitride is a particularly useful material for forming an anti-reflection layer, and is advantageously employed at a thickness of about 0.1 to about 0.5 microns.

As previously indicated herein, there are many different ways in which the temperature can be specifically controlled in the method of this invention, while still achieving the desired result of a broad dynamic exposure range.

When the method is conducted as a two-stage method, the temperature in the first stage should be in the range of from 200° C. to 400° C. Within this range, the particular temperature employed, for example, a temperature of 250° C., or 300° C., or 350° C. will not make a significant difference to the results obtained. It is the temperature employed in the second stage that controls the contrast and exposure latitude of the element, and this temperature should be in the range of 125° C. to 175° C. It is necessary, however, that a major portion of the total thickness of the doped $\alpha$-Si(H) layer be formed at a temperature in the 200° C. to 400° C. range, and only a minor portion be formed at a temperature in the 125° C. to 175° C. range. If the entire deposition is carried out at a fixed relatively low temperature, for example 150° C., the dark conductivity of the resulting element will be too high for effective use in electrophotography. On the other hand, if the entire deposition is carried out at a fixed relatively high temperature, for example 250° C., the element will not exhibit the desired broad dynamic exposure range.

It is, of course, not essential that a two-stage method be used. The method can, if desired, employ three or more stages, beginning with a temperature in the first stage in the 200° C. to 400° C. range, and ending at a temperature in the final stage in the 125° C. to 175° C. range. It is also quite feasible to use a temperature which undergoes a steady gradual decrease from an initial temperature in the 200° C. to 400° C. range to a final temperature in the 125° C. to 175° C. range. A major part of the total layer of doped $\alpha$-Si(H)—that is, more than half of the total thickness—must be formed at a temperature in the 200° C. to 400° C. range; however, with a minor portion—that is less than half of the total thickness—being formed at a temperature in the 125° C. to 175° C. range. Preferably, 60 to 90 percent of the total thickness is formed at a temperature in the 200° C. to 400° C. range, and 10 to 40 percent is formed at a temperature in the 125° C. to 175° C. range. A particularly preferred process involves formation of about eighty percent of the total thickness at a temperature of about 250° C. and formation of the remaining twenty percent at a temperature of about 150° C.

Temperatures between the upper limit of 175° C. of the lower temperature range and the lower limit of 200° C. of the upper temperature range are, of course, not excluded from use in the method of this invention. For example, the method could employ a temperature which gradually decreases from 250° C. to 150° C., with sixty percent of the total thickness being formed in the range of 250° C. to 200° C., twenty percent of the total thickness being formed in the range of 200° C. to 175° C., and twenty percent of the total thickness being formed in the range of 175° C. to 150° C. Alternatively, the method could be a three-stage method forming sixty percent of the thickness in a first stage at 250° C., twenty percent of the thickness in a second stage at 180° C., and twenty percent of the thickness in a third stage at 150° C.

The process of depositing the doped $\alpha$-Si(H) layer can be a single continuous process in which the only change that is made is appropriate variation of the temperature in the manner described hereinabove. This is not essential, however, as the layer can be deposited in two or more separate steps and, in general, the same effect will be observed as long as the temperatures are the same as those used in a single deposition. The effect of extended dynamic exposure range cannot apparently be induced by annealing, or otherwise thermally treating, the deposited layer, and, as far as is known, can only be achieved by appropriate control of the temperature of the deposition process.

Control of the temperature of the deposition process in the manner described herein is capable of extending the dynamic exposure range from a value of about 0.7 to about 0.8 logE, which is typical of the prior art, to a value of as high as 1.4 logE or higher.

The invention is further illustrated by the following example of its practice.

A series of photoconductive insulating elements was prepared utilizing a stainless steel substrate, overcoated with a barrier layer composed of $\alpha$-Si(H) that had been heavily doped with boron, which in turn was overcoated with a photoconductive layer composed of $\alpha$-Si(H) that had been lightly doped with boron. To form these elements, a stainless steel substrate was mounted on a heater block placed in the center of a 200 mm Pyrex glass plasma-reactor tube. The reactor tube was initially evacuated to a pressure of approximately $10^{-4}$ Torr and the substrate temperature was controlled by means of a nichrome heater element. Reaction gases were introduced into the reactor tube to a total pressure of 0.8 Torr. The substrate was maintained at a negative d c potential of several hundred volts, and the deposition rate was in the range of 0.5 microns per hour.

To form the barrier layer, the deposition was conducted at 250° C. at a partial pressure of 0.05 Torr of SiH$_4$ diluted with He and containing 700 ppm of B$_2$H$_6$. After a barrier layer with a thickness of 0.03 microns had been formed, the content of B$_2$H$_6$ in the feed gas was reduced to 15 ppm and a photoconductive layer with a total thickness as indicated in Table I below was formed. This layer was formed in a two-stage temperature-controlled process whereby the deposition was carried out at 250° C. until approximately eighty percent of the total layer thickness had been deposited and was then carried out at 150° C. for the deposition of the remaining twenty percent. In determining contrast and dynamic exposure range, the exposures were derived from a 160 microsecond xenon-filled lamp, filtered to include only the visible region of the spectrum. Results obtained were as follows:

TABLE I

| Test No. | Layer Thickness (microns) | $V_o$ (volts) | $\gamma_{max}$ (V/logE) | $V_o/\gamma_{max}$ (logE) |
|---|---|---|---|---|
| 1 | 13.9 | 60 | 59 | 1.02 |
| 2 | 12.5 | 140 | 142 | 0.99 |
| 3 | 2.4 | 30 | 27 | 1.11 |
| 4 | 2.4 | 30 | 25 | 1.20 |
| 5 | 2.4 | 30 | 31 | 0.97 |
| 6 | 2.4 | 30 | 21 | 0.97 |
| 7 | 2.4 | 30 | 21 | 1.43 |

The average dynamic exposure range of the test samples described in Table I was 1.10 logE.

In comparison, the results reported in Table II below were obtained in tests carried out in an identical manner to those described above except that the temperature was not decreased to 150° C., i.e., it was maintained at 250° C. throughout the deposition.

TABLE II

| Test No. | Layer Thickness (microns) | $V_o$ (volts) | $\gamma_{max}$ (V/logE) | $V_o/\gamma_{max}$ (logE) |
|---|---|---|---|---|
| 1 | 10.3 | 100 | 150 | 0.67 |
| 2 | 14.0 | 175 | 241 | 0.73 |
| 3 | 13.1 | 175 | 233 | 0.75 |
| 4 | 13.1 | 30 | 35 | 0.86 |
| 5 | 13.2 | 200 | 266 | 0.75 |

The average dynamic exposure range of the control samples described in Table II was 0.75 logE, thereby indicating that the temperature controlled process of the present invention provides a very substantial increase in dynamic exposure range.

The invention has been described in detail with particular reference to preferred embodiments thereof, but it will be understood that variations and modifications can be effected within the spirit and scope of the invention.

I claim:

1. In a method for the manufacture of a photoconductive insulating element comprising an electrically-conductive support, a barrier layer overlying said support, and a layer of doped $\alpha$-Si(H) overlying said barrier layer, wherein said layer of doped $\alpha$-Si(H) is formed by a process of plasma-induced dissociation of a gaseous mixture of a silane and a doping agent, the improvement which comprises controlling the temperature of said dissociation process so that an initial major portion of said layer of doped $\alpha$-Si(H) is formed at a temperature in the range of from 200° C. to 400° C. and a final minor portion of said layer of doped $\alpha$-Si(H) is formed at a temperature in the range of from 125° C. to 175° C.

2. The method of claim 1 wherein said doped $\alpha$-Si(H) layer is doped with an element of Group III A or Group V A of the Periodic Table.

3. The method of claim 1 wherein said photoconductive insulating element additionally comprises a layer of intrinsic $\alpha$-Si(H).

4. The method of claim 1 wherein said doped $\alpha$-Si(H) layer is doped with phosphorus.

5. The method of claim 1 wherein said doped $\alpha$-Si(H) layer is doped with boron.

6. The method of claim 1 wherein said doped $\alpha$-Si(H) layer is doped with boron at a concentration in the range of from about 15 to about 150 ppm.

7. The method of claim 1 wherein the hydrogen concentration in said doped $\alpha$-Si(H) layer is in the range of 5 to 25 percent.

8. The method of claim 1 wherein sixty to ninety percent of the total thickness of said doped $\alpha$-Si(H) layer is formed at a temperature in the range of from 200° C. to 400° C. and ten to forty percent of the total thickness of said doped $\alpha$-Si(H) layer is formed at a temperature in the range of from 125° C. to 175° C.

9. The method of claim 1 wherein about eighty percent of the total thickness of said doped $\alpha$-Si(H) layer is formed at a temperature of about 250° C. and about twenty percent of the total thickness of said doped $\alpha$-Si(H) layer is formed at a temperature of about 150° C.

10. A photoconductive insulating element produced by the method of claim 1.

11. A photoconductive insulating element produced by the method of claim 9.

* * * * *